United States Patent [19]
Yuh

[11] Patent Number: 5,973,549
[45] Date of Patent: Oct. 26, 1999

[54] SEMICONDUCTOR DEVICE HAVING INPUT BUFFER WITH REDUCED BIAS VOLTAGE VARIATIONS AND LOW POWER CONSUMPTION

[75] Inventor: Jong Hak Yuh, Ichon, Rep. of Korea

[73] Assignee: Hyundai Electronics Industrial Co., Ltd., Kyoungki-do, Rep. of Korea

[21] Appl. No.: 08/954,877

[22] Filed: Oct. 21, 1997

[30] Foreign Application Priority Data

Oct. 22, 1996 [KR] Rep. of Korea ................. 96-47399

[51] Int. Cl.⁶ ............................................. H03K 19/0185
[52] U.S. Cl. ......................... 327/541; 327/333; 327/437; 327/544; 326/68; 326/81
[58] Field of Search ..................... 326/62, 80, 81, 326/68; 327/333, 539, 540, 541, 542, 543, 544, 437

[56] References Cited

U.S. PATENT DOCUMENTS

| | | | |
|---|---|---|---|
| 4,677,321 | 6/1987 | Bacrania | 326/71 |
| 5,132,555 | 7/1992 | Takahashi | 326/102 |
| 5,283,762 | 2/1994 | Fujishima | 307/65 |
| 5,451,896 | 9/1995 | Mori | 327/543 |
| 5,517,148 | 5/1996 | Yin | 327/333 |
| 5,805,005 | 9/1998 | Raisinghani et al. | 327/333 |
| 5,808,480 | 9/1998 | Morris | 326/83 |

Primary Examiner—Timothy P. Callahan
Assistant Examiner—Terry L. Englund
Attorney, Agent, or Firm—Thelen Reid & Priest LLP

[57] ABSTRACT

An input buffer in a semiconductor device reduces power consumption by decreasing variation of an operation bias voltage. The semiconductor device has an input buffer driving circuit with an inversion circuit at its output, both of which circuits drive the input buffer to cause it to output a power voltage $V_{dd}$ or a ground voltage $V_{ss}$. The driving circuit outputs a "high ground" voltage when an input voltage $V_{in}$ is 1.685 volts, and a "low power" voltage when $V_{in}$ is 1.285 volts. The device also has a circuit that generates reference potentials having a "low power" voltage and "high ground" voltage needed by the driving circuit's power voltage terminal and ground voltage terminal.

9 Claims, 6 Drawing Sheets

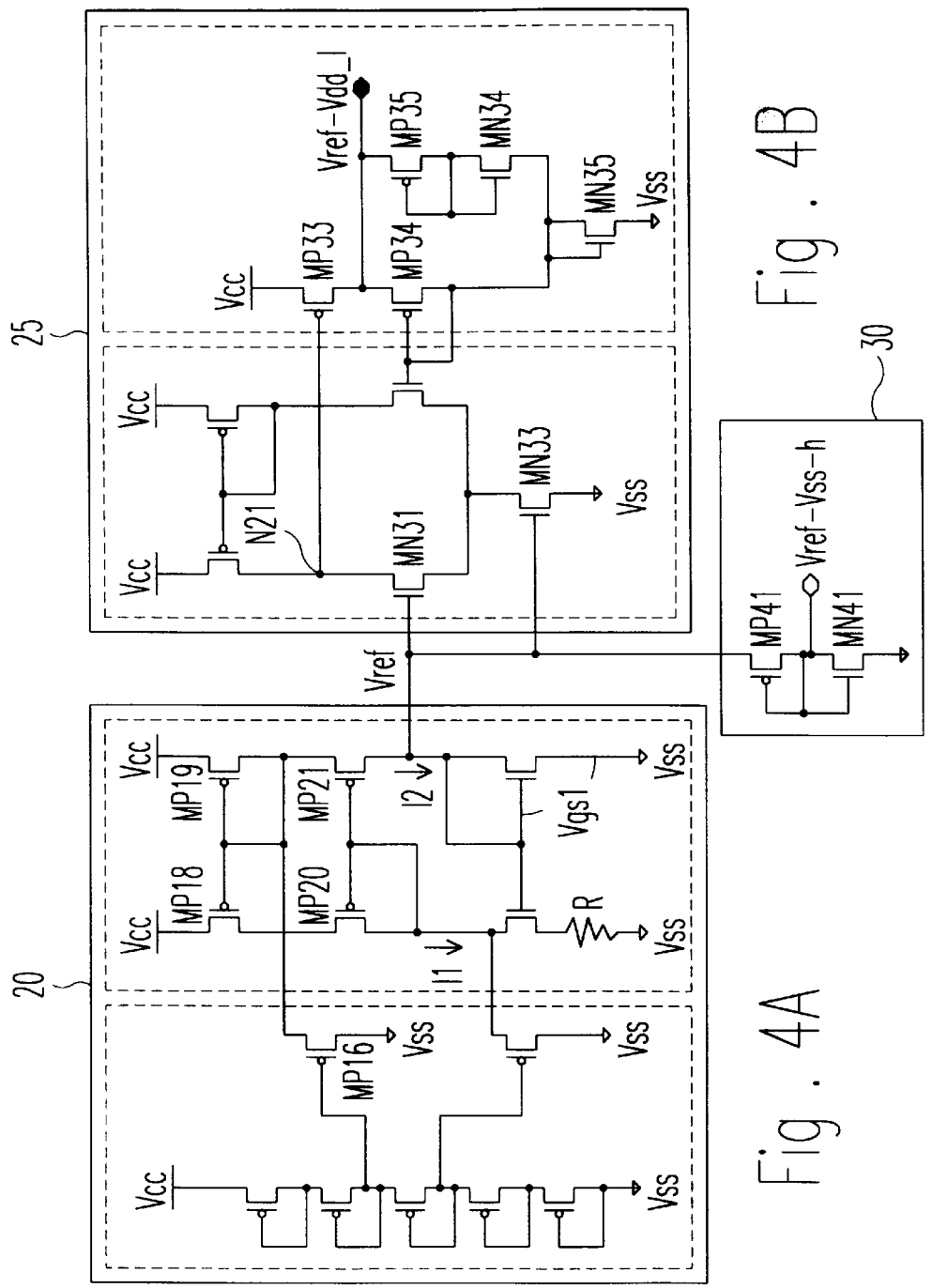

SEMICONDUCTOR DEVICE HAVING INPUT BUFFER WITH REDUCED BIAS VOLTAGE VARIATIONS AND LOW POWER CONSUMPTION

BACKGROUND OF THE INVENTION

1. Field of the Invention

This invention relates an input buffer in semiconductors, and more particularly to an input buffer which can reduce power consumption by decreasing a variation of an operation bias voltage.

2. Description of the Prior Art

FIG. 1 is a conventional input circuit diagram used in a high speed interface according to the prior art.

In case that an input buffer circuit illustrated in FIG. 1 is used as a Stup Series Terminated Trancievcer Logic (SSTTL) interface, a reference voltage Vref is 1.485 volts, while 1.685 or 1.285 volts is supplied to an input terminal Vin. At this time, if a clock enable signal Cken is at a logic "high" level, direct current flows from Vdd power supply terminal to Vss ground terminal since overall transistors of the input buffer are turned on. However, there is a high voltage difference between Vdd and Vss, and this causes a lot of DC to flow in the input circuit, thereby increasing the power consumption.

In particular, the more pins a memory device has (e.g., 8 MB SGRAM has 53 pins in the input buffer), the more the power consumption caused by flowing current in the input buffer will be increased.

As described above, the conventional input buffer has a disadvantage that a wide variation of the bias voltage causes a lot of DC to flow from the power supply terminal to the ground terminal. As a result, the power consumption may be increased.

SUMMARY OF THE INVENTION

Therefore, the present invention is provided to solve the disadvantage involved in the prior art and to provide an input buffer having low power consumption by decreasing a width of variation both of Vdd power supply voltage and Vss ground voltage, resulting in reducing direct current being flowed from a power supply terminal to a ground terminal.

In order to achieve an aspect of the present invention, there is provided a semiconductor device comprising: input buffer driving means for outputting a high ground voltage when an input voltage Vin is 1.685 volts and a low power voltage when the Vin is 1.285 volts; inversion means for inverting an output signal of the input buffer driving means; an input buffer which is driven to output a power voltage and a ground voltage in accordance with output signals of the input buffer driving means and the inversion means inputted therein; and reference potential generating means for generating reference potentials having low power voltage and high ground voltage which is necessary in terminals of the power voltage and of the ground voltage of the input buffer driving means.

BRIEF DESCRIPTION OF THE DRAWINGS

The above object and other features of the present invention will become more apparent by describing the preferred embodiment thereof with reference to the accompanying drawings, in which:

FIG. 4A is a circuit diagram of a reference potential generation section illustrated in FIG. 3.

FIG. 4B is a circuit diagram of a low power voltage reference potential generation section having low power voltage illustrated in FIG. 3.

FIG. 4C is a circuit diagram of a high ground voltage reference potential generation section illustrated in FIG. 3.

DETAILED DESCRIPTION OF THE PREFERRED EMBODIMENT

The preferred embodiments of the present invention will now be explained with reference to the accompanying drawings.

Figure 1:
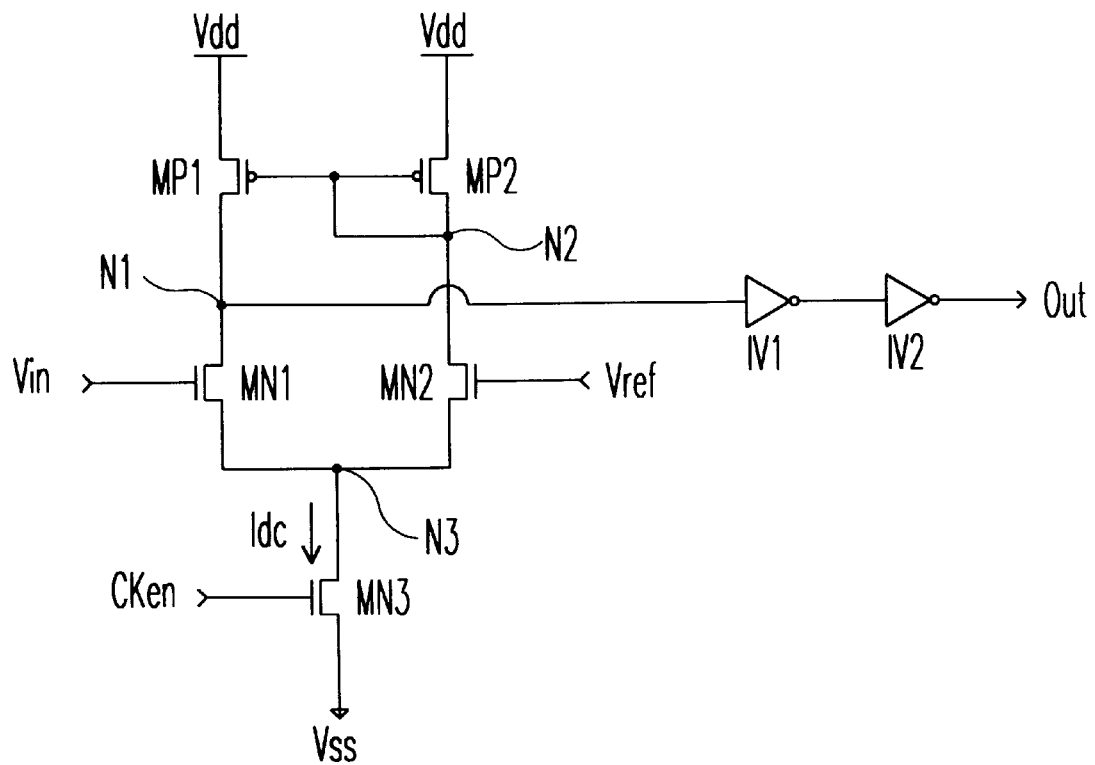
FIG. 1 is an input buffer circuit diagram used in a high speed interface according to the prior art.
Figure 2:
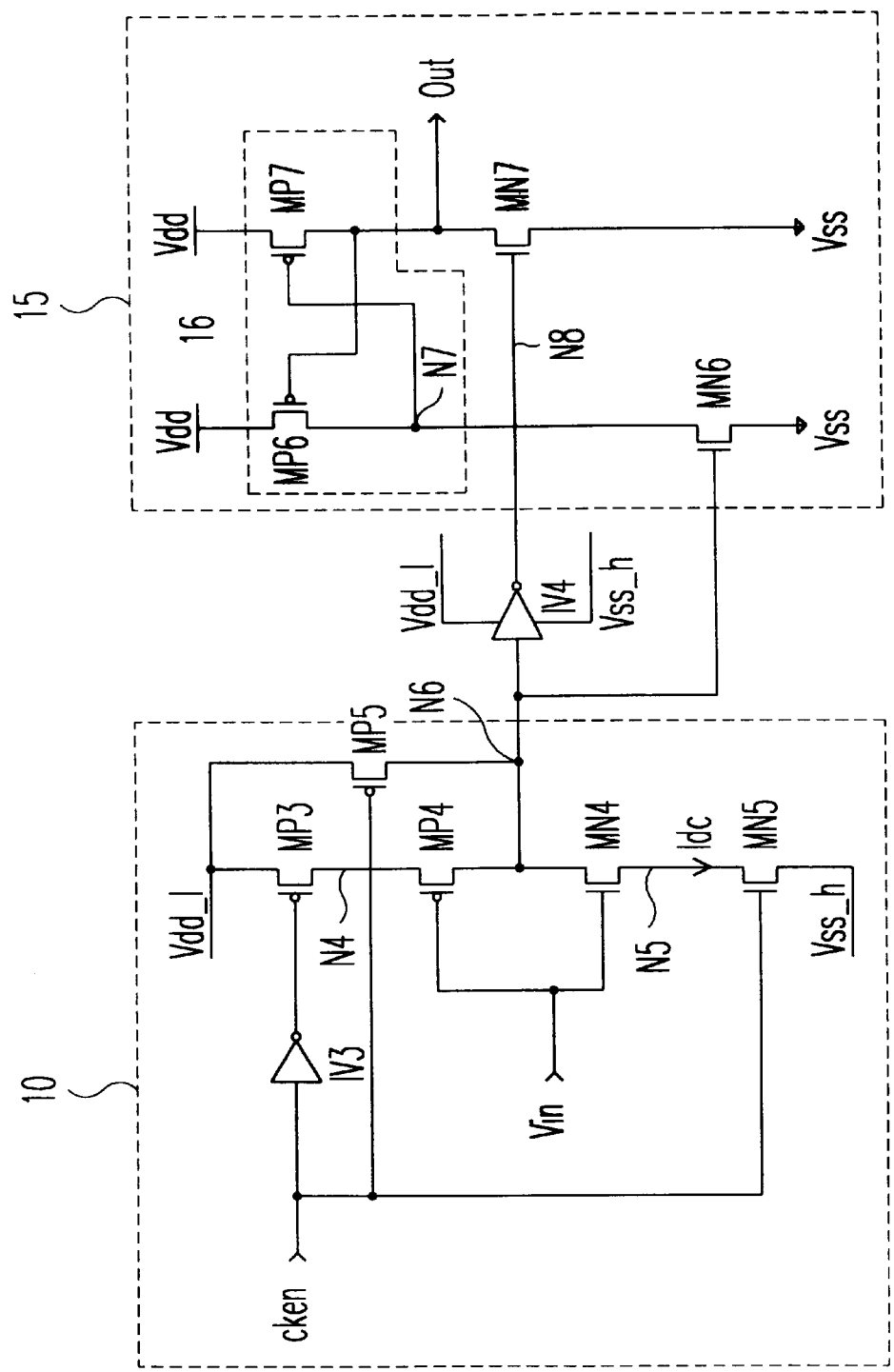
FIG. 2 is an input buffer circuit diagram according to the present invention.

FIG. 2 is an input buffer circuit diagram according to a first embodiment of the present invention. Referring to FIG. 2, the input buffer circuit includes an input buffer driving section 10 for outputting a driving signal of an input buffer section by outputting signals of a high ground voltage Vss-h when an input voltage Vin is 1.685 volts and a low power voltage Vdd-l when the Vdd in is 1.285 volts, an inverter IV4 for inverting an output signal of the input buffer driving section 10 and providing the inverted signal, and an input buffer section 15 for receiving output signals of the input buffer driving section 10 and the inverter IV4, and outputting a power voltage Vdd or a ground voltage Vss.

The operation of the input buffer circuit illustrated in FIG. 2 will be explained with respect to an operational timing diagram illustrated in FIGS. 6 and 7.

First, a node N6 is pre-charged via a PMOS transistor MP5 which is turned on when a clock enable signal Cken is a logic "low" level. Then, if the clock enable signal Cken becomes a logic "high" level, a PMOS transistor MP3 and an NMOS transistor MN5 are each turned on.

At this stage, if the low power voltage Vdd-l is 2.485 volts, the high ground voltage Vss-h is 0.485 volts, 1.685 volts is applied to the input voltage terminal Vin, and a source-gate potential of a PMOS transistor MP4 becomes 2.485 volts–1.685 volts=0.8 volts. In this case, if a threshold voltage of the PMOS transistor MP4 is 0.8 volts, current is not passed since the PMOS transistor MP4 lies on the boundary points of the turn on/off operation. Further, a gate-source potential of an NMOS transistor MN4 becomes 1.685 volts–0.485 volts=1.2 volts. Accordingly, the NMOS transistor MN4 is turned on, and the high ground voltage Vss-h is provided to the node N6.

Meanwhile, if the clock enable signal Cken is at the logic "high" level and if 1.285 volts is supplied to the input voltage terminal Vin, the PMOS transistor MP4 is turned on, and the NMOS transistor MN4 is turned off. Accordingly, the low power voltage Vdd-l is provided to the node N6 to drive the input buffer section.

For a case where the low power voltage Vdd-l and high ground voltage Vss-h are each applied to the input buffer section 15, the operation of the input buffer section will be explained hereinafter.

In a case where the low power voltage Vdd-l is applied to the node N6, the low power voltage Vdd-l is inverted and applied to a gate terminal of an NMOS transistor MN7, and is also applied to an NMOS transistor MN6. Accordingly, the NMOS transistor MN7 is turned off and the NMOS transistor MN6 is turned on, then the ground voltage Vss is applied to a node N7 and the PMOS transistor MP7 is turned on. Thereby, the power voltage Vdd is provided to an output terminal of the transistor MP7.

Further, the PMOS transistor MP6 is turned off by the power voltage Vdd, thereby cutting off the power voltage Vdd to the node N7.

Meanwhile, in a case where a voltage on the node N6 is the high ground voltage Vss-h, the high ground voltage Vss-h is inverted and applied to a gate terminal of the NMOS transistor MN7, while the high ground voltage Vss-h is applied to a gate terminal of the NMOS transistor MN6. Accordingly, the NMOS transistor MN7 is turned on and the NMOS transistor MN6 is turned off, thereby providing the ground voltage Vss to output terminals of transistors MN6 and MN7.

Further, since the PMOS transistor MP6 is turned on by the ground voltage Vss on the output terminal of the MN6, the power voltage Vdd is provided to the node N7, and providing of the power voltage Vdd to the output terminal is cut off, so the power voltage Vdd is applied to the gate terminal of the PMOS transistor MP7.

According to the present invention as described above, there is an advantage that even if the voltage variation of the input voltage potential has a small width, almost no direct current flows in the input buffer circuit.

Thus, the current flows from the low power voltage Vdd-l terminal to the high ground voltage Vss-h terminal only if the input voltage Vin is changed to the normal CMOS. In addition, the PMOS transistor MP4 or the NMOS transistor MN4 are each turned off, indicating the direct current does not flow at all in the case where the variation of the input voltage Vin is determined as 1.685 or 1.285 volts.

Figure 6:
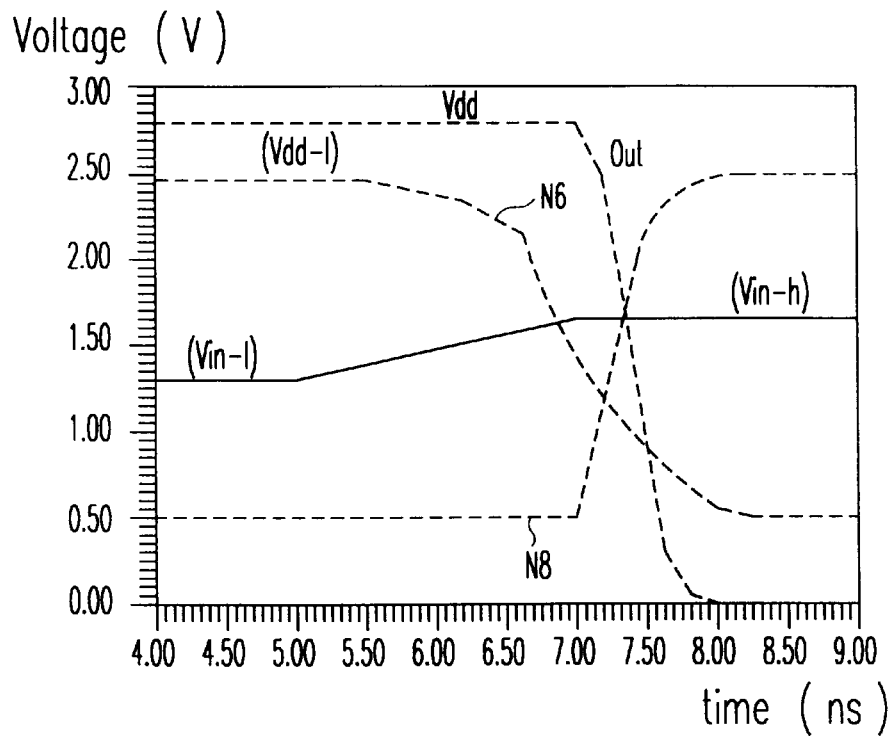
FIG. 6 is an operational timing diagram responsive to an input buffer according to the present invention illustrated in FIG. 2 when an input voltage variation is between 1.285 volts to 1.685 volts.

FIG. 6 illustrates output waveforms of nodes N6, N8 and the output terminal OUT when the input voltage Vin is changed from 1.285 volts into 1.685 volts, wherein the clock enable signal is at the logic "high" level. Referring to FIG. 6, in a case where the potential value on the terminal of the input voltage Vin slowly rises from 1.285 to 1.685 volts, a phase of the node N6 is changed from the low power voltage Vdd-l to the high ground voltage Vss-h, while a phase of the node 8 is changed from the high ground voltage Vss-h to the low power voltage Vdd-l and the output terminal is changed from the power voltage to the ground voltage.

Figure 7:
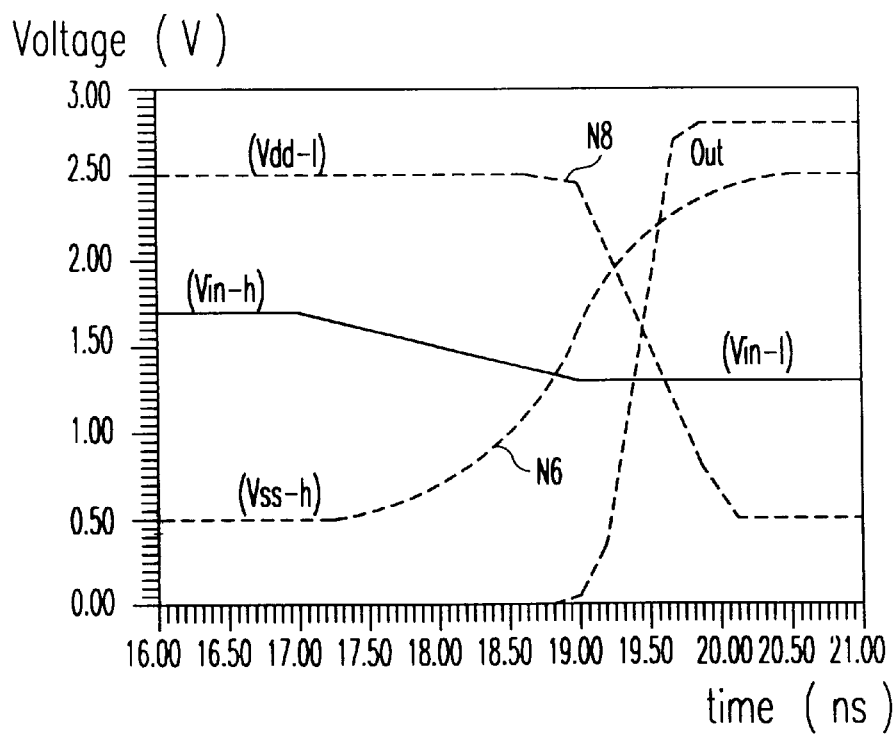
FIG. 7 is an operational timing diagram responsive to an input buffer according to the present invention illustrated in FIG. 2 when an input voltage variation is between 1.685 volts to 1.285 volts.

FIG. 7 illustrates output waveforms of nodes N6, N8 and the output terminal when the input voltage Vin is changed from 1.685 volts into 1.285 volts, wherein the clock enable signal Cken is at the logic "high" level. Referring to FIG. 7, in a case where a potential value on the terminal of the input voltage Vin slowly falls from 1.685 to 1.285 volts, the voltage on the node N6 is changed from the high ground voltage Vss-h to the low power voltage Vdd-l, while the low power voltage Vdd-l is varied to the high ground voltage Vss-h on the node 8 and the ground voltage is also varied to the power voltage on the output terminal.

In the input buffer of the present invention described as above, there is an advantage that the power consumption will be reduced because the voltage variation between the power supply terminal and the ground terminal is smaller than the prior input buffer, thereby decreasing an amount of current flowing from the power supply terminal to the ground terminal.

Figure 3:
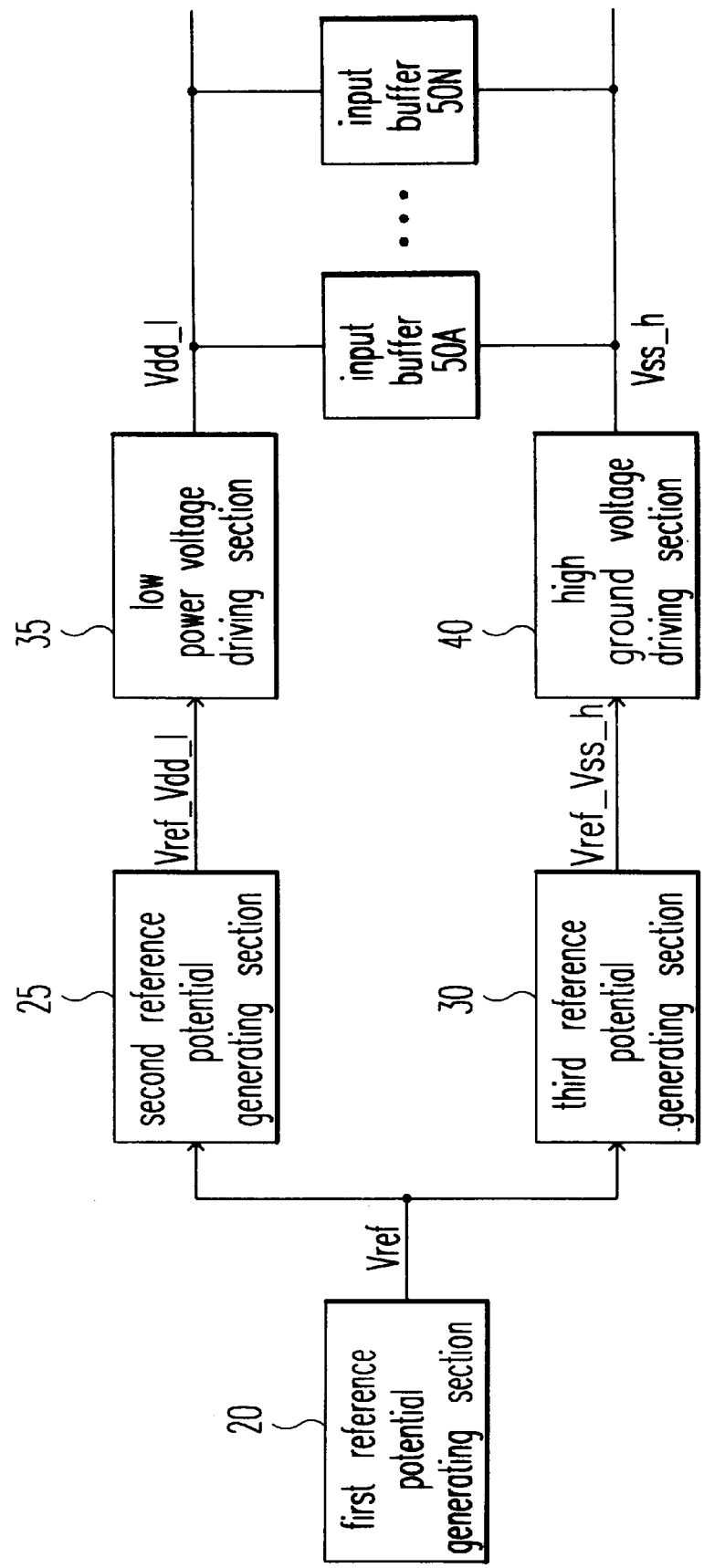
FIG. 3 is a block diagram of a potential generator according to the present invention.

FIG. 3 is a block diagram of the potential generator according to a preferred embodiment of the present invention. The potential generator includes a first reference potential generating section 20 for generating a reference potential, a second reference potential generating section 25 for generating a reference potential having low power voltage Vref-Vdd-l in accordance with the reference potential received therein, a third reference potential generating section 30 for generating a reference potential having high ground voltage Vref-Vss-h in accordance with the reference potential received therein, a low power voltage driving section 35 for generating a low power voltage Vdd-l in accordance with the reference potential having low power voltage Vref-Vdd-l received therein, a high ground voltage driving section 40 for generating a high ground voltage Vss-h in accordance the reference potential having high ground voltage Vref-Vss-h received therein, and a plurality of input buffers 50A–50N driven by the low power voltage Vdd-l or the high ground voltage Vss-h.

Hereinafter, the preferred embodiments of each block shown in FIG. 3 will be explained with respect to FIGS. 4A through 4C, 5A and 5B.

First, the operation of the reference potential generating section 20 illustrated in FIG. 3 will be explained with reference to FIG. 4A. The PMOS transistors MP18 and MP19 are composed of a current mirror means. At this point, if the two transistors MP18 and MP19 have the same size, the current flowing through the two transistors MP18 and MP19 may be the same amount.

In a similar manner, the PMOS transistors MP20 and MP21 are also composed of another current mirror, so the currents I1 and I2 flowing on each terminal of the current mirrors may be the same, too.

Wherein, $$I2 = \beta/2 \times (Vgsl - Vt) \quad \text{equation (1)}$$

$$I1 = I2 \quad \text{equation (2)}$$

If the current I2 is almost equal to 0, i.e., there is almost no current, the condition Vgsl=Vt=Vref will be satisfied from the equation (1).

Accordingly, in order to satisfy the conditions that I2=I1 and I2 is almost 0, a resistor R with a large value when compared to a normal value is used.

FIG. 4B illustrates the reference potential generating circuit 25 having a low power voltage shown in FIG. 3, and its operation will be explained hereinafter.

In a case where the reference potential which is an output signal of the reference potential generating section 20 rises, the NMOS transistors MN31 and MN33 are each turned on, thereby decreasing the potential at the node N21. Accordingly, the PMOS transistor MP33 is turned on, so the reference potential having low power voltage Vref-Vdd-l which is the output signal of the reference potential generating section 20 having lower power voltage is raised.

Herein, Vref-Vdd-l=(1+R1/R2)×Vref (Wherein, R1 is an equivalent resistor of PMOS transistors MP34 and MP35 and an NMOS transistor MN34, while R2 is an equivalent resistor of an NMOS transistor MN35.) Hence, it is noted that the reference potential having low power voltage Vref-Vdd-l is obtained by adjusting the values of the resistors R1 and R2.

FIG. 4C illustrates the reference potential generating circuit 30 having a high ground voltage shown in FIG. 3. Referring to FIG. 4C, the reference potential generating circuit 30 includes a PMOS transistor MP41 whose gate terminal is connected to the output terminal of the reference potential having high ground voltage Vref-Vss-h and is connected between the output terminal of the reference potential generating section 20 and the output terminal of the reference potential having high ground voltage Vref-Vss-h, an NMOS transistor MN41 whose gate terminal is connected to the output terminal of the reference potential having high ground voltage Vref-Vss-h and is connected between the output terminal of the reference potential having high ground voltage Vref-Vss-h and the ground voltage Vss.

In FIG. 4C illustrated as above, if an equivalent resistor of the PMOS transistor MP41 is determined as R3 and an equivalent resistor of the NMOS transistor MN41 is R4, the reference potential having high ground voltage Vref-Vss-h will be [R4/(R3+R4)]×Vref.

Figure 5A:
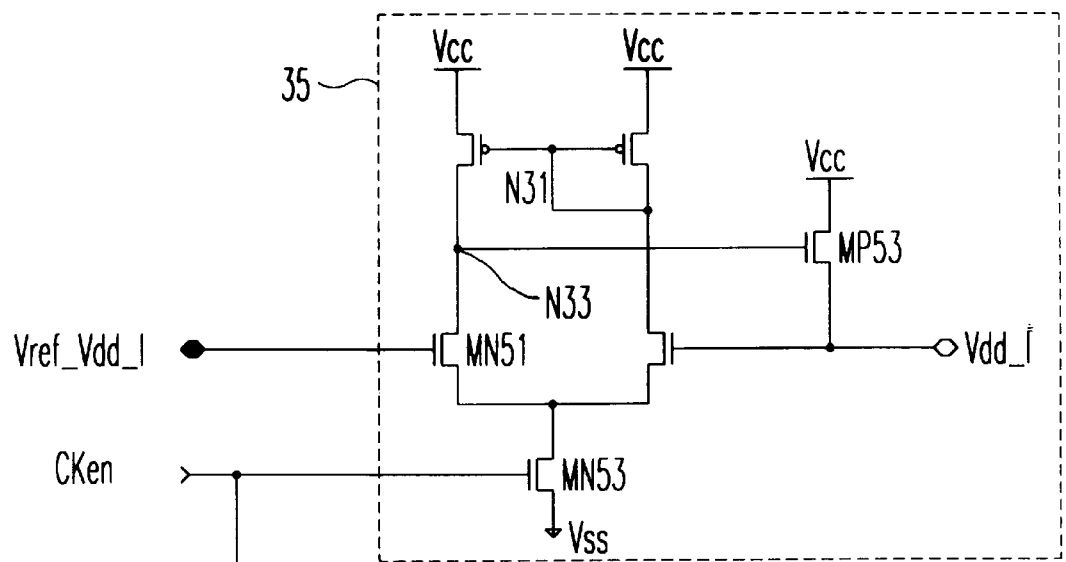
FIG. 5A is a circuit diagram of a low power voltage driving section illustrated in FIG. 3.

FIG. 5A illustrates the low power voltage driving circuit 35 shown in FIG. 3. In FIG. 5A, if the clock enable signal Cken is at the logic "high" level, an NMOS transistor MN53 is turned on, while if the reference potential having low power voltage Vref-Vdd-l is raised, an NMOS transistor MN51 is turned on, thereby decreasing a potential at node N31. Accordingly, a gate-inputting potential of the PMOS transistor MP53 will be dropped and subsequently the PMOS transistor MP53 is turned on, so the potential of the low power voltage Vdd-l is raised.

Figure 5B:
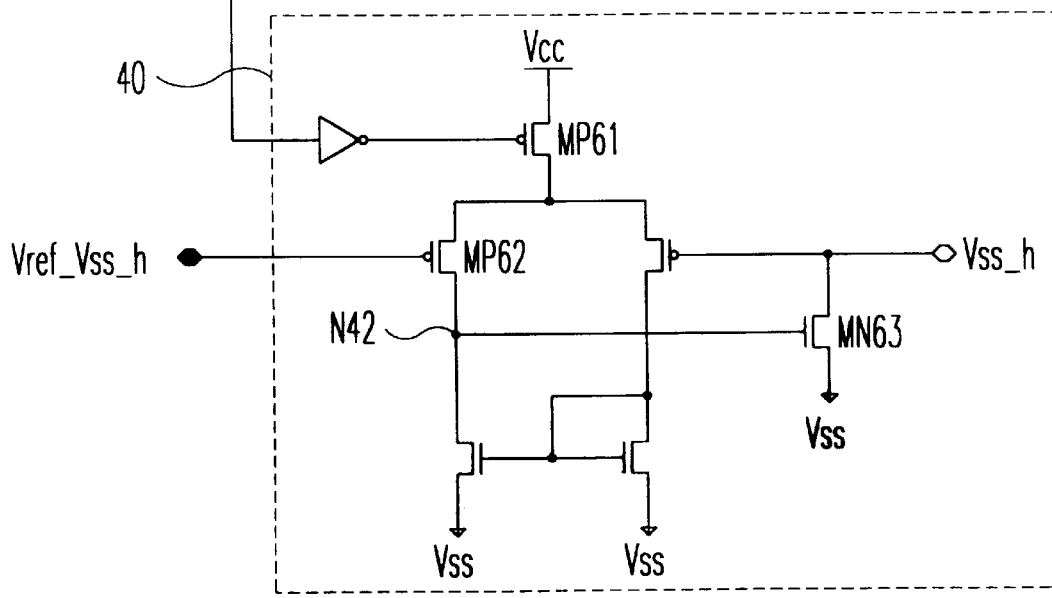
FIG. 5B is a circuit diagram of a high ground voltage driving section illustrated in FIG. 3.

FIG. 5B illustrates the high ground voltage driving circuit 40 shown in FIG. 3. In FIG. 5B, if the clock enable signal Cken is at the logic "high" level, a PMOS transistor MP61 is turned on, while if the reference potential having high ground voltage Vref-Vss-h falls, a PMOS transistor MP62 is turned on, thereby rising a potential at node N42. Accordingly, an NMOS transistor MN63 is turned on and the high ground voltage Vss-h is then dropped.

As described above, if the input buffer of the present invention is embodied in the semiconductor devices, the power consumption is reduced to a minimum value, and the power is well used by the interface requiring high speed.

The present invention can be also applied to input buffer terminals of DRAM, SRAM, ROM, memory devices, and non-memory devices.

Many modifications and variations of the present invention are possible in light of the above teachings. Therefore, it is to be understood that within the scope of the appended claims, the invention may be practiced otherwise than as specifically described.

What is claimed is:

1. A semiconductor device having an input buffer circuit with low power consumption, the device comprising:
   first reference potential generating means for generating a first reference potential;
   second reference potential generating means for generating a second reference potential of low power voltage in accordance with the first reference potential;
   third reference potential generating means for generating a third reference potential of high ground voltage in accordance with the first reference potential;
   low power voltage driving means for generating a first driving voltage in accordance with the second reference potential;
   high ground voltage driving means for generating a second driving voltage in accordance with the third reference potential;
   the input buffer circuit, which is driven by the first driving voltage and the second driving voltage; and
   an input buffer driving means, whose operation is controlled by a clock enable signal, for driving the input buffer circuit so that the input buffer circuit is activated while the input buffer driving means is activated.

2. The device of claim 1, wherein the input buffer driving means includes:
   first outputting means, turned on by the clock enable signal, for outputting the first driving voltage to a first node;
   second outputting means, turned on by the clock enable signal, for outputting the second driving voltage to a second node;
   third outputting means, turned on when an input voltage has a first potential higher than the second driving voltage, for outputting the first driving voltage to a third node;
   fourth outputting means, turned on when the input voltage has a second potential higher than the first potential and lower than the first driving voltage, for outputting the second driving voltage to the third node; and
   fifth outputting means, turned on by the clock enable signal, for pre-charging the third node with the first driving voltage.

3. The device of claim 1, wherein the first reference potential generating means includes:
   start up means for outputting a start driving signal; and
   current mirror means, having first and second current mirrors, for outputting the first reference potential in response to the start driving signal.

4. The device of claim 3, wherein the start up means includes:
   a plurality of transistors including at least three transistors, each of the transistors functioning as a diode, connected between a power supply terminal and a ground terminal;
   first switching means, turned on by a first potential provided from one terminal among the plurality of transistors, for driving the first current mirror of the current mirror means; and
   second switching means, turned on by a second potential provided from another terminal among the plurality of transistors, for driving the second current mirror of the current mirror means;
   wherein the first potential is higher than the second potential.

5. The device of claim 1, wherein the second reference potential generating means includes:
   a differential amplifier for receiving the first reference potential; and
   output voltage controlling means for receiving an output from the differential amplifier and for outputting the second reference potential of low power voltage.

6. The device of claim 1, wherein:
   the third reference potential generating means includes a PMOS transistor and an NMOS transistor connected in series;
   a gate of the PMOS transistor and a gate of the NMOS transistor are coupled together with a drain of the NMOS transistor;
   the first reference potential is applied to a source of the PMOS transistor;
   ground voltage is applied to a source of the NMOS transistor; and a voltage of the drain of the NMOS transistor is the third reference potential.

7. The device of claim 1, wherein the low power voltage driving means includes:
- a differential amplifier that is driven by the clock enable signal and the second reference potential; and
- an MOS transistor that is turned on by an output signal of the differential amplifier and outputs the first driving voltage.

8. The device of claim 1, wherein the high ground voltage driving means includes:
- a differential amplifier driven by the clock enable signal and the third reference potential; and
- an MOS transistor that is turned on by an output signal of the differential amplifier and outputs the second driving voltage.

9. A semiconductor device having an input buffer circuit with low power consumption, the device comprising:
- first reference potential generating means for receiving an external signal and for generating a first potential lower than a power voltage;
- second reference potential generating means for receiving the external signal and for generating a second potential higher than a ground voltage;
- input buffer means that is driven by the first potential and the second potential; and
- input buffer driving means, whose operation is controlled by a clock enable signal, for driving the input buffer means so that the input buffer means is activated while the input buffer driving means is activated.

* * * * *